United States Patent [19]

Okamura et al.

[11] Patent Number: 5,075,650
[45] Date of Patent: Dec. 24, 1991

[54] BANDPASS FILTER

[75] Inventors: Hisatake Okamura; Teruhisa Tsuru; Tetsuo Taniguchi; Ken Tonegawa, all of Kyoto, Japan

[73] Assignee: Murata Manufacturing Co., Ltd., Nagaokakyo, Japan

[21] Appl. No.: 567,582

[22] Filed: Aug. 15, 1990

[30] Foreign Application Priority Data

Aug. 16, 1989 [JP] Japan .................................. 1-211136

[51] Int. Cl.$^5$ ............................................. H03H 7/09
[52] U.S. Cl. ..................................... 333/177; 333/185
[58] Field of Search ......................... 333/167, 174–180, 333/184, 185, 219, 204; 361/321, 308; 336/200

[56] References Cited

U.S. PATENT DOCUMENTS

| 4,591,814 | 5/1986 | Ito et al. | 333/185 X |
| 4,614,925 | 9/1986 | Kane | 333/185 X |
| 4,894,629 | 1/1990 | Okamura et al. | 333/185 X |
| 4,904,967 | 2/1990 | Morii et al. | 333/185 |
| 4,916,582 | 4/1990 | Okamura et al. | 361/321 |
| 4,918,570 | 4/1990 | Okamura et al. | 361/321 |

Primary Examiner—Eugene R. LaRoche
Assistant Examiner—Seung Ham
Attorney, Agent, or Firm—Armstrong, Nikaido, Marmelstein, Kubovcik & Murray

[57] ABSTRACT

A bandpass filter consisting of two dielectric resonators coupled with each other, the bandpass filter comprising: a filter body including an intermediate grounding layer, a first pair of dielectric layers, a pair of inductor layers, a second pair of dielectric layers, a pair of outer grounding electrode layers and a pair of protecting layers, one of each pair being laminated on an upper surface of the intermediate grounding electrode layer in the above order to constitute a first resonator and the other of each pair being laminated on a bottom surface of the intermediate grounding electrode layer in the above order to constitute a second resonator; and a plurality of outer connecting terminals provided on outer surfaces of said filter body and connected to predetermined layers among the intermediate grounding electrode layer, inductor layers and outer grounding electrode layers; wherein the intermediate grounding electrode layer has a coupling portion for magnetically coupling one inductor layer formed on the upper surface thereof with the other inductor layer formed on the bottom surface thereof.

14 Claims, 7 Drawing Sheets

BANDPASS FILTER

BACKGROUND OF THE INVENTION

1) Field of the Invention

The present invention relates to a bandpass filter for use in a portable transceiver or the like in a frequency range of several hundred megahertz several gigahertz 2) Description of the Prior Art As a bandpass filter used in a frequency range of several hundred megahertz—several gigahertz, there are one shown in FIG. 1 proposed by the inventors of the present invention and a helical filter as shown in FIG. 2. FIG. 1a is a front view, FIG. 1b is a side view and FIG. 1c is a rear view.

The bandpass filter shown in FIG. 1 has a construction as described below. A baked dielectric substrate 130 has substantially C-shaped conductive films 131 and 132 symmetrically arranged on its front surface and substantially C-shaped conductive films 133 and 134 symmetrically arranged on its back surface. The conductive films 131 and 132 are soldered with grounding terminals 135, and the conductive films 133 and 134 are soldered with external lead terminals 136. Then, this bandpass filter, excluding the projecting portions of the grounding terminals 135 and the external lead terminals 136, is immersed in an insulating resin bath, whereby the bandpass filter is wrapped up by a resin film.

Each of the conductive films 131 to 134 comprises two capacitor electrodes 131a and 131b, 132a and 132b, 133a and 133b, or 134a and 134b, and one inductor electrode 131c, 132c, 133c or 134c. The capacitor electrodes 131a, 131b, 132a and 132b are opposed to the capacitor electrodes 133a, 133b, 134a and 134b, respectively, across the dielectric substrate 130 and each opposed pair of capacitor electrodes has a capacitance determined by the dielectric constant and thickness of the dielectric substrate 130 and surface area where one of the capacitor electrodes is opposed to the other. On the other hand, the inductor electrodes 131c to 134c connect the capacitor electrodes 131a to 131b, 132a to 132b, 133a to 133b and 134a to 134b, respectively.

Each of the inductor electrodes 131c to 134c has a inductance. Therefore, a pair of conductive films opposed to each other across the dielectric substrate 130 constitutes an LC resonator. In FIG. 1, two such LC resonators on the dielectric substrate 130 are magnetically coupled with each other because the inductor electrodes 131c and 132c are closely positioned, thereby constituting a bandpass filter.

On the other hand, the helical filter shown in FIG. 2 has a construction wherein two helical resonators 140 are magnetically coupled with each other through cutouts 142. The cutouts 142 are provided by cutting out the opposed portions of the metal caps 141. Number 143 indicates an insulator and number 146 indicates a coil wound around the insulator 143.

In the bandpass filter shown in FIG. 1, shielding is necessary to prevent affection by outer electromagnetic field. The shielding, however, requires a shielding metal plate to be provided away from the conductive films 131 through 134 in a desired distance, which results in a large size bandpass filter.

On the other hand, in the helical filter shown in FIG. 2, the metal caps serve as shielding members and no separate shielding member is required. However, this filter is difficult to be compact and is not suitable for surface mounting.

SUMMARY OF THE INVENTION

An object of the present invention, therefore, is to provide a bandpass filter which is compact and suitable for surface mounting.

Another object of the present invention is to provide a devised bandpass filter wherein each resonator has a simple construction and serves as a shielding member.

The above objects are achieved by a bandpass filter consisting of two dielectric resonators coupled with each other, the bandpass filter comprising: a filter body including an intermediate grounding layer, a first pair of dielectric layers, a pair of inductor layers, a second pair of dielectric layers, a pair of outer grounding electrode layers and a pair of protecting layers, one of each pair being laminated on an upper surface of the intermediate grounding electrode layer in the above order to constitute a first resonator and the other of each pair being laminated on a bottom surface of the intermediate grounding electrode layer in the above order to constitute a second resonator; and a plurality of outer connecting terminals provided on outer surfaces of the filter body and connected to predetermined layers among the above intermediate grounding electrode layer, inductor layers and outer grounding electrode layers; wherein the intermediate grounding electrode layer has a coupling portion for magnetically coupling one inductor layer formed on the upper surface thereof with the other inductor layer formed on the bottom surface thereof.

The inductor layers may be lengthy, spiral conductive films formed on planes interposed between the first pair of dielectric layers and the second pair of dielectric layers.

The inductor layers may be spiralled in the same direction to be magnetically coupled with additive polarity.

The coupling portion of the intermediate grounding electrode layer may be a window provided at the position corresponding to the centers of the spirals of the inductor layers.

The inductor layers may be lengthy, winding conductive films formed on planes interposed between the first pair of dielectric layers and the second pair of dielectric layers.

The outer grounding electrode layers may be plate-like and have such shapes that substantially cover the inductor layers.

The intermediate grounding electrode may comprise two metal films which have cutouts extending in opposite directions, each cutout having a length larger than the half of the width of each metal film and the coupling portion may be a window provided at the portion where the two cutouts are opposed to each other.

The metal films may be opposed to each other with a non-conductive sheet therebetween.

The inductor layers may be extended from ends and portions thereof to be exposed on side surfaces of the filter body; and outer grounding electrode layers and metal films may be exposed to be exposed on side surfaces of the filter body.

The above ends may be outermost ends of the spirals.

The outer connecting terminals may include a first terminal formed to cover exposed portions extending from the above end of the inductor layer and the outer grounding electrode layer of the first resonator and from one of the metal films; a second terminal formed to cover exposed portions extending from the above end of the inductor layer and the outer grounding electrode layer of the second resonator and from the other of the metal films; a third terminal formed to cover the exposed portion extending from the above portion of the inductor layer of the first resonator; and a fourth terminal formed to cover the exposed portion extending from the above portion of the inductor layer of the second resonator. The filter body may have a rectangular shape, the exposed portions extending from the inductor layer and the outer grounding electrode layer of the first resonator and from one of the metal films may be on the same side surface of the filter body and the exposed portions extending from the inductor layer and the outer grounding electrode layer of the second resonator and from the other of the metal films may be on another side surface of the filter body.

The exposed portions extending from the above end of the inductor layer and the outer grounding electrode layer of the first resonator and from one of the metal films may be aligned in a vertical line, the exposed portion extending from the above portion of the inductor layer of the first resonator may be off the above line, the exposed portions extending from the above end of the inductor layer and the outer grounding electrode layer of the second resonator and from the other of the metal films may be aligned in a vertical line, and the exposed portion extending from the above portion of the inductor layer of the second resonator may be off the above line.

The intermediate grounding electrode layer may comprise a metal film having a window as the coupling portion.

In the above construction, inductances are obtained by the inductor layers and capacitances are obtained between the inductor layers, outer grounding electrode layers and intermediate grounding electrode layer. Therefore, each dielectric resonator equivalently constitutes an LC resonator. Further, two resonators are magnetically coupled with each other through the coupling portion of the intermediate grounding electrode layer interposed therebetween to constitute a bandpass filter which is equivalently the same as a helical filter However, this bandpass filter is different from the helical filter in construction and has a flat shape, which is suitable for surface mounting In addition, in this bandpass filter, since the outer grounding electrode layers serve as shielding members, a separate shielding member can be dispensed with. Further, the degree of the coupling of the two resonators can be adjusted by varying the size or the like of the coupling portion, which enables the filter to be thinner without losing proper magnetic coupling.

BRIEF DESCRIPTION OF THE DRAWINGS

These and other objects, advantages and features of the invention will become apparent form the following description thereof taken in conjunction with the accompanying drawings which illustrate a specific embodiments of the invention. In the drawings.

DESCRIPTION OF THE PREFERRED EMBODIMENT

Figure 1A:
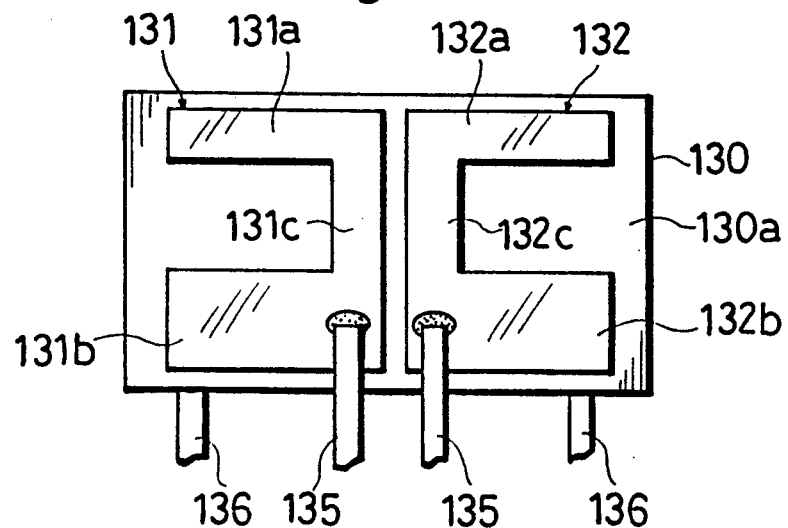
FIG. 1a is a front view showing the construction of a conventional bandpass filter.
Figure 1B:
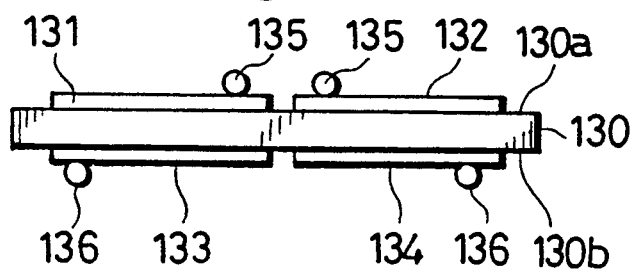
FIG. 1b is a side view of FIG. 1a, FIG. 1c a rear view of FIG. 1a, FIG. 2 is a cross section showing another conventional bandpass filter.
Figure 1C:
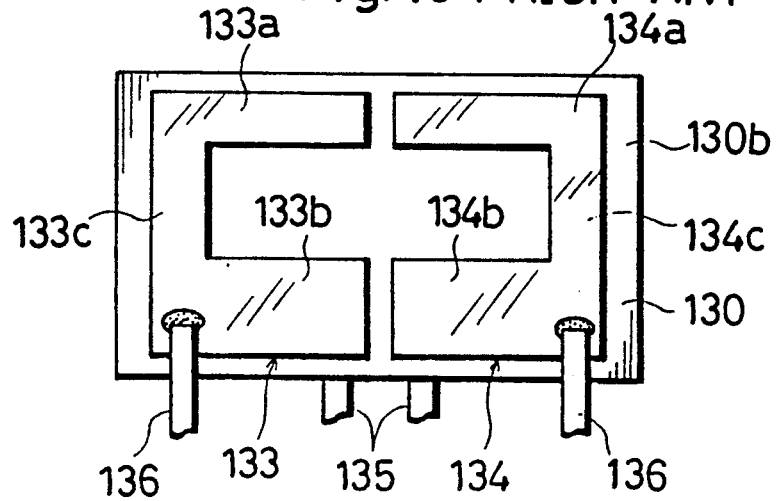
Figure 2:
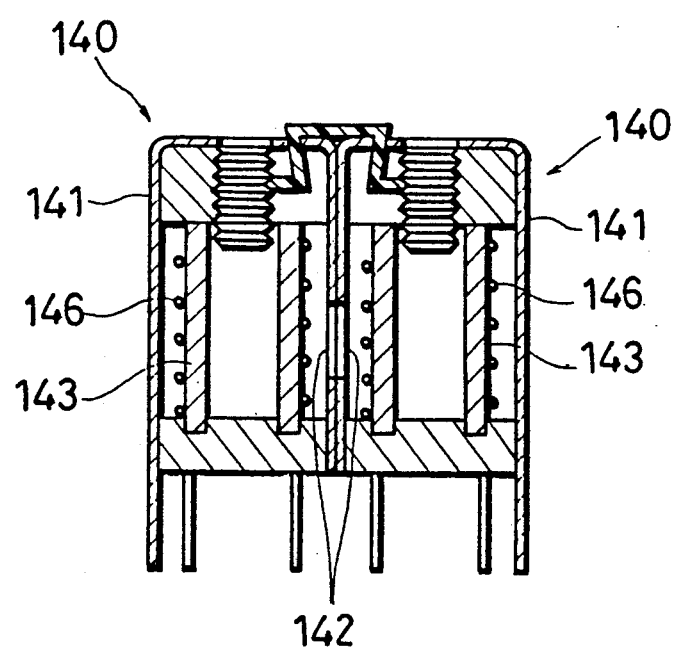
Figure 3:
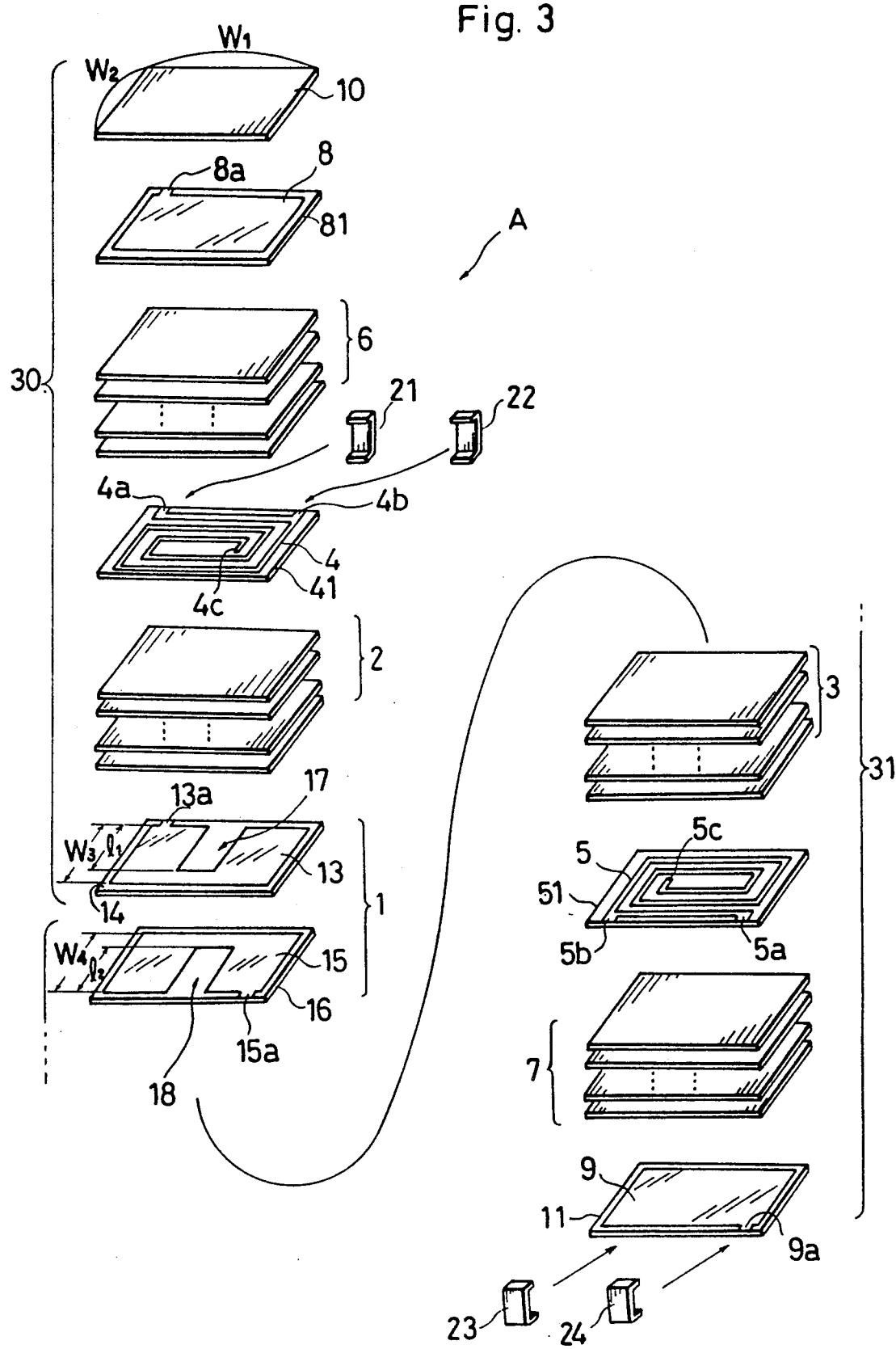
FIG. 3 is an exploded perspective view showing an embodiment of the bandpass filter according to the present invention.
Figure 4A:
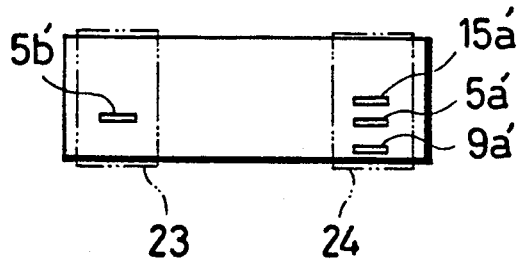
FIG. 4a is a front view of FIG. 3.

FIG. 3 is an exploded perspective view showing the construction of the bandpass filter according to the present invention. FIG. 4a is a front view of FIG. 3 and FIG. 4b a rear view. This bandpass filter comprises a filter body A and outer connecting terminals 21 to 24, each of which extends from a portion of the upper surface to a portion of the bottom surface of the filter body A across the side surface thereof. The filter body A comprises an intermediate grounding electrode 1, first dielectric layers 2 and 3, conductive films 4 and 5 as inductor elements, second dielectric layers 6 and 7, outer grounding electrodes 8 and 9, and protecting sheets 10 and 11. The first dielectric layer 2, conductive film 4, second dielectric layer 6, outer grounding electrode 8 and protecting sheet 10 are laminated on the upper surface of the intermediate grounding electrode 1 in this order, and the first dielectric layer 3, conductive film 5, second dielectric layer 7, outer grounding electrode 9 and protecting sheet 11 are laminated on the bottom surface thereof in this order.

The intermediate grounding electrode 1 constitutes a first dielectric resonator 30 along with the dielectric layers 2 and 6, conductive film 4 and outer grounding electrode 8, and a second dielectric resonator 31 along with the dielectric layers 3 and 7, conductive film 5 and outer grounding electrode 9.

The conductive films 4 and 5 as the inductor elements are of spiral form and have a inductance determined by the length from the outermost end 4a to the innermost end 4c, and a inductance determined by the length from the outermost end 5a to the innermost end 5c, respectively. The conductive films 4 and 5 are formed on the dielectric sheets 41 and 51, respectively, before these sheets are laminated. In the two resonators 30 and 31, the conductive films 4 and 5 are spiralled in the same direction. This allows the two conductive films 4 and 5 to be coupled with additive polarity.

The outer grounding electrodes 8 and 9 are plate-like and have such shapes that substantially cover the conductive films 4 and 5. Thus, the outer grounding electrodes 8 and 9 shield the conductive films 4 and 5, and capacitances are obtained therebetween. Each capacitance is determined by the distance between the outer grounding electrode 8 or 9 and the conductive film 4 or 5, surface area where the outer grounding electrode 8 or 9 is opposed to the conductive film 4 or 5, and the dielectric constant of the dielectric layer 6 or 7. Outer grounding electrode 8 and 9 are formed on a dielectric sheet 81 and a protecting sheet 11, respectively, before these sheets are laminated.

The intermediate grounding electrode 1 comprises a dielectric sheet 14 having a metal film 13 formed thereon and a dielectric sheet 16 laminated on the dielectric sheet 14 and having a metal film 15 formed thereon. Since the metal film 13 and the conductive film 4 are opposed to each other across the dielectric layer 2, a capacitance is obtained therebetween. Similarly, a capacitance is obtained between the metal film 15 and the conductive film 5. As a result, one resonator 30 constitutes an LC resonance circuit having an inductance of the conductive film 4 and capacitances obtained between the conductive film 4, the outer grounding electrode 8 and the metal film 13. The other resonator 31 constitutes an LC resonance circuit having an inductance of the conductive film 5 and capacitances obtained between the conductive film 5, and outer grounding electrode 9 and the metal film 15.

Figure 6:
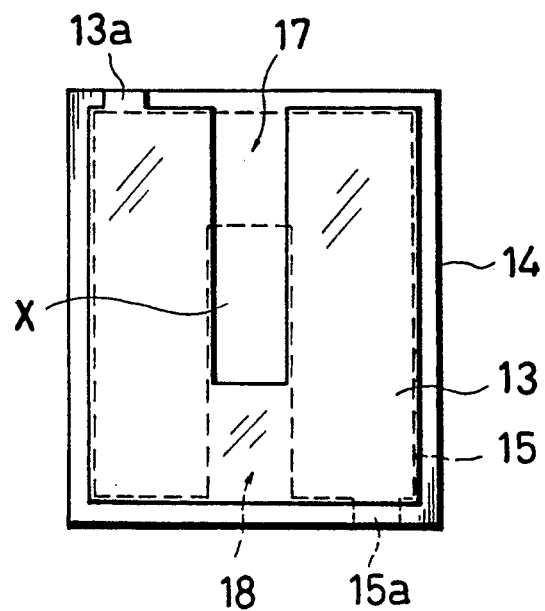
FIG. 6 is a plan view showing the construction of the intermediate grounding electrode.
Figure 7A:
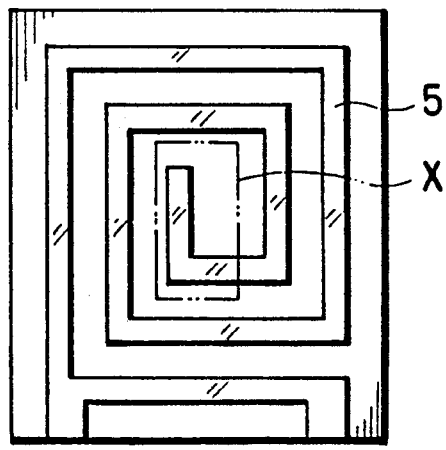
FIGS. 7a and 7b are plan views showing the positional relationship between the conductive films and the coupling window.
Figure 7B:
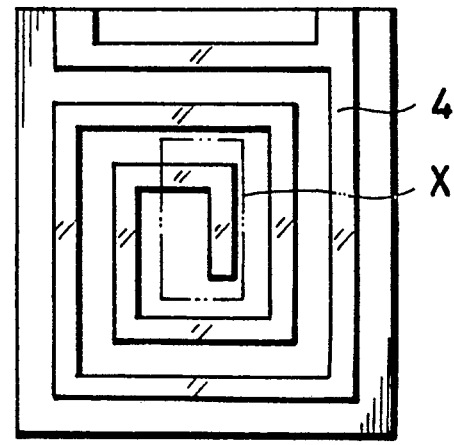

The above two metal films 13 and 15 have cutouts 17 and 18, respectively. The length $l_1$ of the cutout 17 is larger than the half of the width $W_3$ of the metal film 13 and the length $l_2$ of the cutout 18 is larger than the half of the width $W_4$ of the metal film 15. Since the cutouts 17 and 18 extend in opposite directions, a window X is provided at an area where the cutout 17 is opposed to or overlap the cutout 18, as shown in FIG. 6. FIGS. 7a and 7b are plan views showing the positional relationship between the conductive films 4 and 5, and the window X. The window X is at the position corresponding to the centers of the spirals of the conductive films 4 and 5, as shown in FIGS. 7a and 7b. Since the magnetic field is strongest at the center of the spiral theoretically, enough coupling is obtained even if the window X is small.

Each of the dielectric layers 2, 3, 6 and 7 has a predetermined thickness so that desired capacitances are secured between the conductive films 4 and 5, the grounding electrodes 8 and 9 and the metal films 13 and 15. The protecting sheets 10 and 11 are formed of dielectric substance and are for covering and protecting the outer grounding electrodes 8 and 9.

The dielectric sheets 41, 51, 81, 14 and 16, and protecting sheets 10 and 11 have the same thickness (for example, 40 μm). In this embodiment, each of the dielectric layers 2, 3, 6 and 7 comprises a plurality of sheets having the same thickness and laminated one on another. If the sheets having the same thickness are used as described above, the trouble of preparing sheets of different thicknesses can be avoided. In addition, since the thicknesses of the dielectric layers 2, 3, 6 and 7 determine the capacitances, the capacitances can be adjusted by varying the number of the sheets to be laminated.

The conductive film 4 is extended from the end 4a and a portion 4b to be exposed on a side surface of the filter body A, and the conductive film 5 is extended from the end 5a and a portion 5b to be exposed on another side surface of the filter body A. The portion 4b is away from the end 4a in a predetermined distance, and the portion 5b from the end 5a.

Figure 4B:
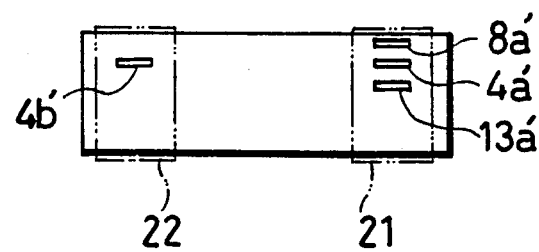
FIG. 4b is a rear view of FIG. 3, FIGS. 5a and 5b are plan views showing the relationship between the conductive films and the outer grounding electrodes.
Figure 5A:
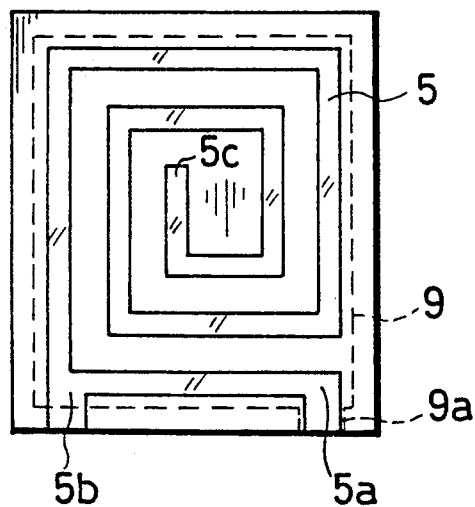
Figure 5B:
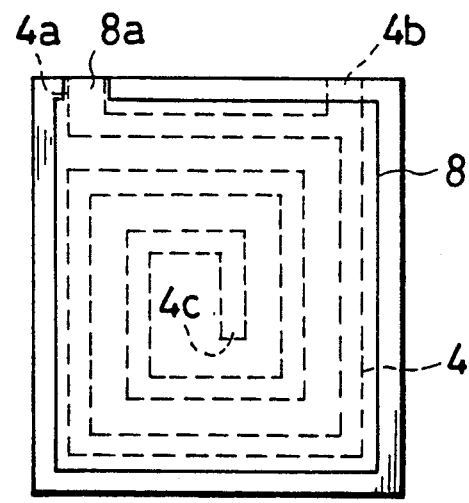

Further, the outer grounding electrodes 8 and 9 are extended from portions 8a and 9a to be exposed on the side surfaces of the filter body A and the metal films 13 and 15 are extended from portions 13a and 15a to be exposed on the side surfaces of the filter body A (FIGS. 4a and 4b).

In this embodiment, the filter body A has a rectangular shape. The exposed portions 4a', 4b', 8a' and 13a' of the resonator 30 are on the same side surface and the exposed portions 5a', 5b', 9a' and 15a' of the resonator 31 are on the opposite side surface from the above side surface.

The exposed portions 4a', 8a' and 13a' are aligned in a vertical line and the exposed portions 5a', 9a' and 15a' are aligned in a vertical line, as shown in FIGS. 4a and 4b. On the other hand, exposed portions 4b' and 5b' are off the above lines.

Of connecting terminals 21 to 24, grounding terminals 21 and 24 are formed on the side surfaces in such a manner that they cover the exposed portions 4a', 8a', 13a', 5a', 9a' and 15a' and input/output terminals 22 and 23 are formed on the side surfaces in such a manner that they cover the exposed portions 4b 40 and 5b'.

A bandpass filter having the above construction is manufactured as follows. A plurality of unbaked dielectric green sheets are prepared and conductive pastes are printed on six of them in predetermined patterns. Then, the dielectric green sheets having the conductive pastes printed thereon and those not having the conductive pastes are laminated and pressure-adhered. Thereafter, conductive pastes are pasted on predetermined parts of the predetermined surfaces of the product to form the connecting terminals. Finally, the obtained product is fired. By this firing process, the pressure-adhering of the laminated dielectric sheets is secured and the conductive pastes are baked on the dielectric sheets as the conductive films, the outer grounding electrodes, the metal films and the connecting terminals.

A bandpass terminal can also be manufactured as follows. A plurality of dielectric sheets having large areas are prepared and a plurality of conductive films are formed on two of them in matrix form, a plurality of outer grounding electrodes on another two, and a plurality of metal films on another two. Then, these six sheets and the other sheets are laminated in a predetermined order and the product is pressure-adhered. Thereafter, the obtained product is divided into a plurality of bandpass filter units. Finally, the units are fired. According to this method, it is easier to expose the conductive films, outer grounding electrodes and metal films on side surfaces of the filter body A, and also mass production is realized if the laminated green sheets are cut at appropriate positions.

Figure 8:
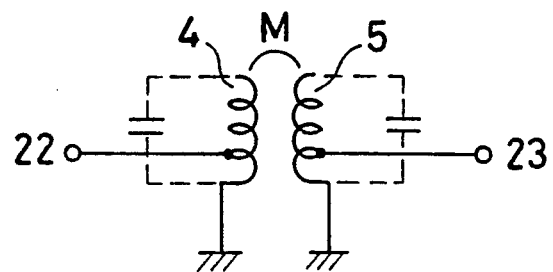
FIG. 8 is a view of an equivalent circuit of the bandpass filter of FIG. 3.

In the bandpass filter having the above construction, the conductive films 4 and 5, and outer grounding electrodes 8 and 9; and conductive films 4 and 5, and metal films 11 and 13 are electrically connected with each other. Therefore, even if the conductive films and grounding electrodes, or conductive films and metal films are closely positioned, large capacities can be obtained without causing discharging. This enables resonant frequency to be lowered. In addition, the degree of the coupling can be adjusted by varying the size of the window X. FIG. 8 shows an equivalent circuit of a bandpass filter having the above construction. In FIG. 8, M indicates magnetic coupling.

Figure 9:
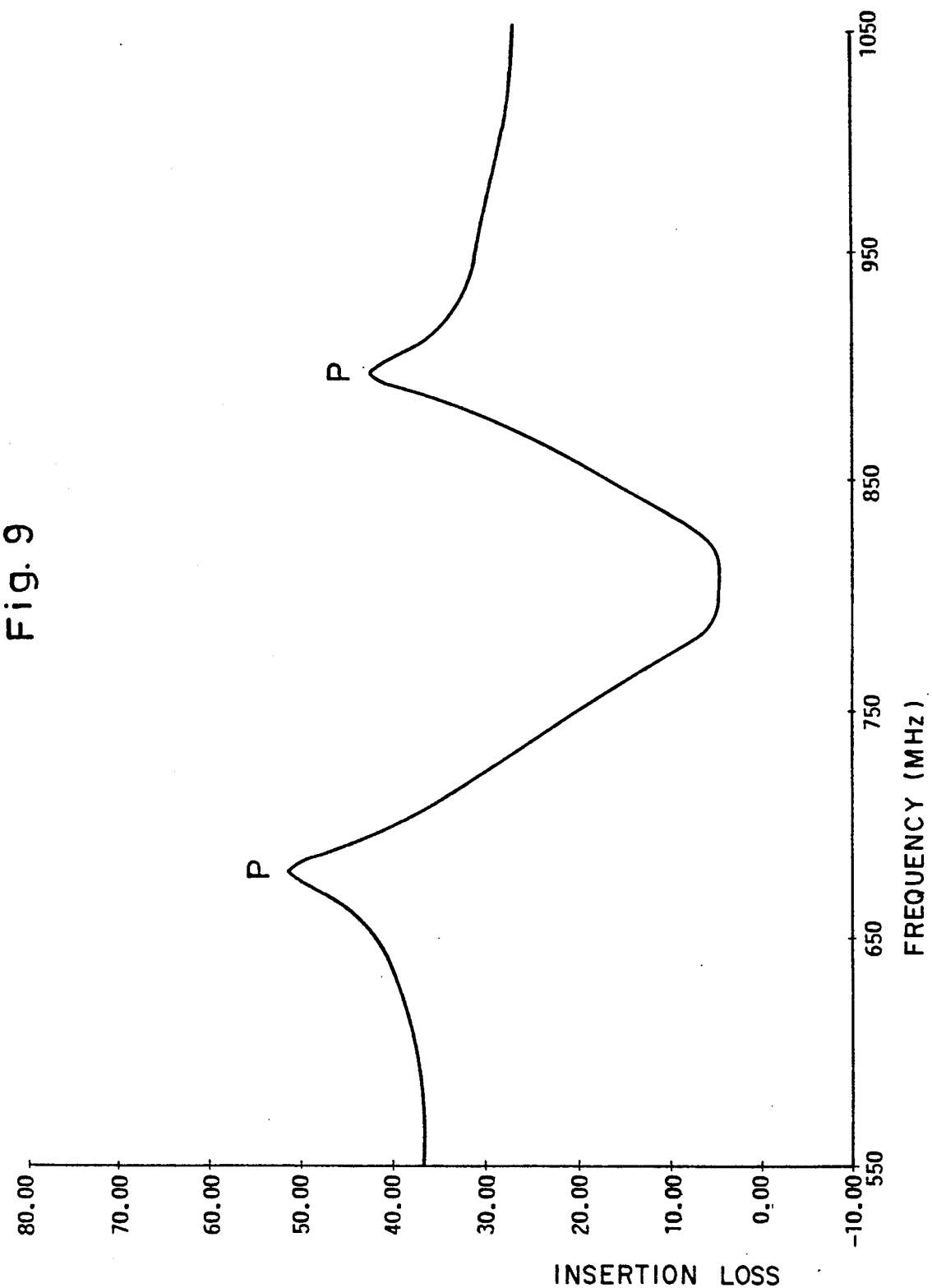
FIG. 9 is a graph showing a frequency characteristic of the bandpass filter of FIG. 3.

FIG. 9 shows a frequency characteristic of the above bandpass filter wherein each of the conductive films 4 and 5, and grounding electrodes 8 and 9 has a thickness of 300 μm, and the bandpass filter has a length of $W_1$ of 5 mm and a width of $W_2$ of 5.7 mm (refer to FIG. 3). As will be understood from FIG. 9, poles P occur at both sides of the passband. The poles P are considered to occur because floating capacity is formed between the two resonators 30 and 31 which are coupled with each other via the window X. If the window X is too large, the two resonators are coupled tight and the bandwidth becomes wide, resulting in a double-humped characteristic. The size of the window X, therefore, is to be determined in order not to give rise to such problems.

According to FIG. 9, the frequency characteristic has the center frequency at about 800 MHz. The frequency characteristic can be adjusted so that it has the center frequency in a range of several hundred megahertz—several gigahertz by varying the shapes of the conductive films 4 and 5, and the thicknesses of the dielectric layers 2, 3, 6 and 7.

The above bandpass filter is flat in shape and so, it can be mounted on a printed circuit board by positioning the connecting terminals 21 and 24 so that they easily be soldered on conductive lands of the printed circuit board. In this process, the protecting sheets 10 and 11 prevent the upper and bottom surfaces of the bandpass filter from being scratched.

Figure 10:
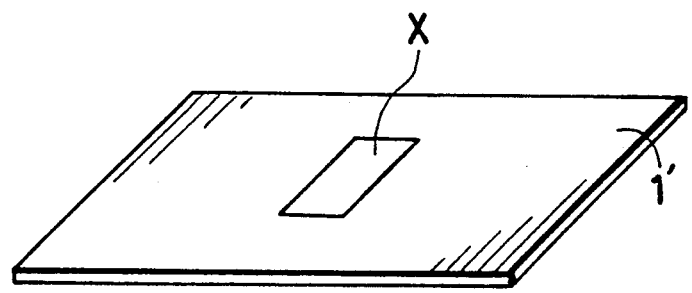
FIG. 10 is a perspective view showing another example of the intermediate grounding electrode.
Figure 11:
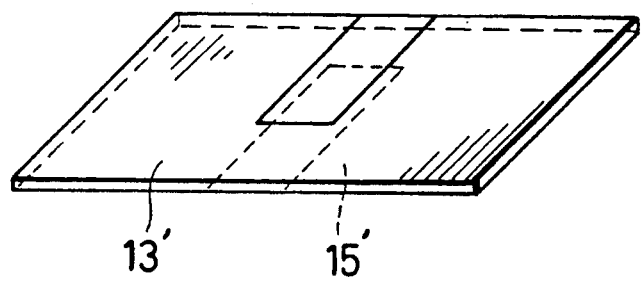
FIG. 11 is a perspective view showing another example of the intermediate grounding electrode.

FIGS. 10 and 11 are perspective views, each showing another example of the intermediate grounding electrode. In FIG. 10, an intermediate grounding electrode 1' having a window X at the center thereof is formed on one surface of a dielectric sheet. In FIG. 11, metal films 13' and 15' are formed on both surfaces of a dielectric sheet. The metal films 13' and 15' have the same shape as the metal films 13 and 15 shown in FIG. 3.

Figure 12:
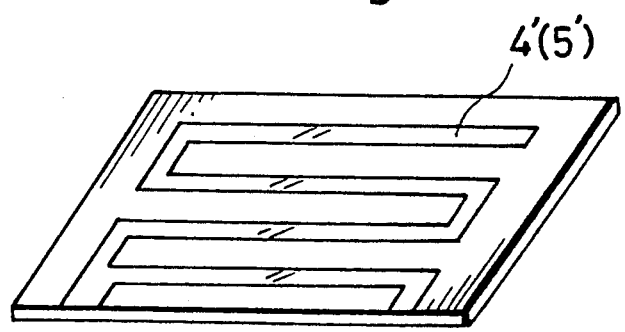
FIG. 12 is a perspective view showing another example of the conductive film.

FIG. 12 shows another example of the conductive films 4 and 5. The conductive films 4' or 5' is winding on the dielectric sheet.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A bandpass filter consisting of two dielectric resonators coupled with each other, said bandpass filter comprising:
a filter body including an intermediate grounding electrode layer, a first pair of dielectric layers, a pair of inductor layers respectively mounted on said first pair of dielectric layers, a second pair of dielectric layers respectively mounted on said pair of inductor layers, a pair of outer grounding electrode layers and a pair of protective layers respectively mounted on said second pair of dielectric layers, one of each pair being laminated on an upper surface of the intermediate grounding electrode layer to constitute a first resonator and the other of each pair being laminated on a bottom surface of the intermediate grounding electrode layer to constitute a second resonator; and
a plurality of outer connecting terminals provided on outer surfaces of said filter body and respectively connected to at least one of the intermediate grounding electrode layer, inductor layers and outer grounding electrode layers,
wherein said intermediate grounding electrode layer has a coupling portion for magnetically coupling one inductor layer formed on the upper surface thereof with the other inductor layer formed on the bottom surface thereof.

2. A bandpass filter as claimed in claim 1, wherein each of the pair of inductor layers is a lengthy, spiral conductive film respectively formed on planes interposed between the each of the first pair of dielectric layers and the second pair of dielectric layers.

3. A bandpass filter as claimed in claim 2, wherein the inductor layers are spiralled in the same direction to be magnetically coupled with additive polarity.

4. A bandpass filter as claimed in claim 3, the coupling portion of the intermediate grounding electrode layer is a window provided at the position corresponding to the centers of the spirals of the inductor layers.

5. A bandpass filter as claimed in claim 1, wherein each of the pair of inductor layers is a lengthy, winding conductive film respectively formed on planes interposed between the each of the first pair of dielectric layers and the second pair of dielectric layers.

6. A bandpass filter as claimed in claim 4, wherein the outer grounding electrode layers are plate-like and have such shapes that substantially cover the inductor layers.

7. A bandpass filter as claimed in claim 6, wherein the intermediate grounding electrode compresses two metal films which have cutouts extending in opposite directions, each cutout having a length larger than the half of the width of each metal film, and wherein the coupling portion is a window provided at overlapping portions of the cutouts of the two metal films.

8. A bandpass filter as claimed in claim 7, wherein the metal films are opposed to each other with a non-conductive sheet therebetween.

9. A bandpass filter as claimed in claim 8, wherein the inductor layers are extended from end portions thereof to be exposed on side surfaces of said filter body; and outer grounding electrode layers and metal films are exposed to be exposed on side surfaces of said filter body.

10. A bandpass filter as claimed in claim 9, wherein the end portions of the inductor layers exposed on side surfaces of the filter body are outermost ends of the spirals.

11. A bandpass filter as claimed in claim 9, wherein the outer connecting terminals include a first terminal formed to cover exposed portions extending from the end portion of the inductor layer and the outer grounding electrode layer of the first resonator and from one of the metal films; a second terminal formed to cover exposed portions extending from the end portion of the inductor layer and the outer grounding electrode layer of the second resonator and from the other of the metal films; a third terminal formed to cover the exposed portion extending from the end portion of the inductor layer of the first resonator; and a fourth terminal formed to cover the exposed portion extending from the end portion of the inductor layer of the second resonator.

12. A bandpass filter as claimed in claim 11, wherein said filter body has a rectangular shape and wherein the exposed portions extending from the inductor layer and the outer grounding electrode layer of the first resonator and from one of the metal films are on the same side surface of said filter body and the exposed portions extending from the inductor layer and the outer grounding electrode layer of the second resonator and from the other of the metal films are on another side surface of said filter body.

13. A bandpass filter as claimed in claim 12, wherein the exposed portions extending from the end portion of the inductor layer and the outer grounding electrode layer of the first resonator and from one of the metal films are aligned in a vertical line and the exposed portion extending from the end portion of the inductor layer of the first resonator is off the above line; and wherein the exposed portions extending from the end portion of the inductor layer and the outer grounding electrode layer of the second resonator and from the other of the metal films are aligned in a vertical line and the exposed portion extending from the end portion of the inductor layer of the second resonator is off the above line.

14. A bandpass filter as claimed in claim 1, wherein the intermediate grounding electrode layer comprises a metal film having a window as the coupling portion.

* * * * *